United States Patent [19]

Horiguchi

[11] 3,966,999
[45] June 29, 1976

[54] METHOD OF PROCESSING AN ORGANIC HIGH MOLECULAR WEIGHT FILM

[75] Inventor: Kazuo Horiguchi, Kyoto, Japan

[73] Assignee: Susmu Industrial Co., Ltd., Kyoto, Japan

[22] Filed: Aug. 16, 1974

[21] Appl. No.: 498,846

[30] Foreign Application Priority Data
Sept. 14, 1973 Japan................................ 48-104787

[52] U.S. Cl.................................. 427/41; 204/165
[51] Int. Cl.² ............................................ B05D 3/06
[58] Field of Search ............... 427/39, 40, 41, 38; 204/164, 165, 168, 170; 118/49.1, 49.5, 51.5

[56] References Cited
UNITED STATES PATENTS

| | | | |
|---|---|---|---|
| 2,932,591 | 4/1960 | Goodman | 427/41 |
| 3,318,790 | 5/1967 | Carbajal et al. | 427/41 |
| 3,449,154 | 6/1969 | Katz | 427/41 |

FOREIGN PATENTS OR APPLICATIONS

| | | | |
|---|---|---|---|
| 7,892 | 5/1972 | Japan | 427/41 |

*Primary Examiner*—John H. Newsome
*Attorney, Agent, or Firm*—Kurt Kelman

[57] ABSTRACT

The invention disclosed relates to an improved method for glow discharge treatment of organic high molecular weight film. When glow discharge treatment is effected in the presence of an organic monomer vapor, the deposit coating is found to be uniform throughout a wide area while being soluble in a particular organic solvent.

6 Claims, 7 Drawing Figures

METHOD OF PROCESSING AN ORGANIC HIGH MOLECULAR WEIGHT FILM

This invention relates to an improved method of processing an organic high molecular weight film by means of a glow discharge apparatus. More particularly, the present invention provides a method for processing an organic high molecular weight film through a polymerization deposit of the organic high molecular weight coating directly upon substrate by means of glow discharge within an apparatus containing organic monomer vapor, said coating being uniformly deposited throughout a wide space, and being soluble in an organic solvent.

It has been well known to polymerize an organic monomer using a glow discharge apparatus. That is, glow discharge may be performed between a pair of oppositely disposed discharge electrodes within an apparatus containing an organic monomer vapor, whereby a coating is deposited on a body, termed a substrate hereinafter, disposed at the surface of or in front of an electrode. However, the organic high molecular weight film produced by prior art methods is generally insoluble in any organic solvent because a crosslinking reaction takes place. Such a film, which is insoluble in any organic solvent due to the crosslinking reaction, is valuable if used solely because of such a property, but such a film has to be improved in physical and chemical properties in order to be usable more extensively. For example, if the insoluble film deposited on a substrate is to have a portion partially removed, a separate masking must be applied over the portion where no film is desired before the glow discharge treatment is performed. If a complicated pattern of organic high molecular weight film is necessary, making methods become unsuitable or insufficient, and it becomes necessary to remove undesired film portions by more complicated means.

A method is also known whereby a photosensitive resin compound is coated on a substrate by means of a sprayer, or a solution of a high molecular weight substance is coated thereon and dried. However, any film obtained through such spraying or coating means has an undesirably large minimum thickness, and is deficient because of pin holes, thereby making the product unsatisfactory for use in electronic parts. Accordingly, if glow discharge polymerization, which easily provides a uniform film as thin as less than several microns, could be improved to provide an organic film which is not only uniform but also is soluble in an organic solvent, the utility of such a film would be widely enlarged. It has now been found that by practice of the present invention there is provided an effective method for overcoming disadvantages stated above in prior art methods.

Practice of the present invention will become more apparent from consideration of the following description taken in conjunction with the accompanying drawings wherein.

Figure 1:
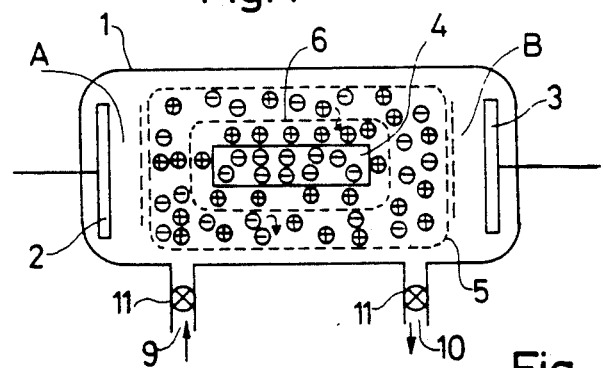
FIG. 1 is an illustrative diagram showing generally the principle of deposit of organic high molecular weight film by glow discharge onto a substrate.

In FIG. 1, a glow discharge device is schematically illustrated, and includes reaction tube 1 for glow discharge, discharge electrodes 2 and 3, which are oppositely mounted in reaction tube 1 at left and right sides thereof, and substrate 4 disposed between electrodes 2 and 3. If electrodes 2 and 3 be positioned at a sufficient distance, a positive column will be established between the electrodes by causing an electrical discharge to take place. The positive column may be a so called plasma zone 5, in which electrons and ions are present at substantially the same densities, and which may be considered as a kind of conductive gas. If substrate 4 be disposed within the plasma zone in a state such that the substrate is electrically floating within both discharge electrodes, then electrons, which have much more energy than ions in the plasma zone 5, will travel faster than ions thereby making the surface of substrate 4 negative due to electrons colliding against the surface. The negative potential in the substrate surface is much lower than the plasma potential, and is about several to ten volts. Because of the lowering of potential at the substrate surface, electrons will tend to be repelled therefrom, whereby an equilibrium will be reached between the surface of the substrate and the space nearby. Thus, in the space closely adjacent the surface of the substrate having a negative potential, the electron density will become low due to electrons being repelled, and the substrate will be surrounded by a thin cloud of ions, i.e., ion sheath 6 of plasma zone 5. Because the surface of substrate 4 within plasma zone 5 will be electrically screened by ion sheath 6, the polymerized film deposited directly onto the substrate 4 by means of glow discharge polymerization will not be exposed to collisions of electrons having high energy. For this reason, the depositing rate of the polymerized coating is not as high as that in the discharge space (space A and B in FIG. 1) other than at the electrode surfaces and the positive column (plasma zone). Therefore, the crosslinking reaction which is caused by collision of high energy electrons is very low and, accordingly, the organic coating deposited on the substrate through suitably modified glow discharge will generally be soluble in the starting monomer or in those organic solvents analogue thereto, except monomers which will cause a crosslinking reaction, such as for example, a di-vinyl-benzene mixture. Useful monomers include, for example, styrene and methyl anthranylate. However, in practical application, glow discharge often tends to be abnormal, or the monomer gas pressure is often varied, so that there is often found a material in powder state of polymerization which partially deposits. The glow discharge may often concentrate partially to prevent the formation of organic high molecular weight film having an equal level of solubility over a wide area thereby making the deposit partially insoluble. Such a film would also have disadvantages with regard to subsequent processing. Besides variation in the glow discharging state, the field intensity at glow discharge is much higher in zones in the vicinity of both discharge electrodes, and there is frequently seen in such zones film being deposited in the positive column, the deposited film being insoluble in any organic solvent. Thus, zones which may provide a film soluble in organic solvent are limited and unstable. Having studied processes for making films without defects which characterize prior art methods, I have surprisingly found a process which will now be described.

A pair of screening plates 7 having suitably sized perforations are disposed on each side of plasma zone 5 in the vicinity of both ends thereof in a state such that the plates electrically float in the discharges from electrodes 2 and 3. The perforations are preferably circular and may have a diameter of about 2-3 mm, being spaced apart about 2-3 mm. The preferred electrode material is aluminum, and the preferred range of current density is from 0.3–0.6 m A/sq.cm. Both screening plates are disposed relatively close to the tube wall and are connected with each other by means of a conductor 8. Within space (p) between the screening plates are disposed a number of substrates 4, for instance of glass, ceramic, plastic or metal, on which organic high molecular weight film is to be deposited uniformly. The deposited film is found to be soluble in a certain organic solvent. If a glow discharge is set up with screening plates disposed as indicated above, spaces (q) and (r) between screening plates 7 and discharge electrodes 2 and 3, respectively, have high brightness, whereas space (p), corresponding to the plasma zone, between the pair of screening plates 7 wherein the group of substrates are disposed, will be relatively dark. Thus, space (p) between the pair of screening plates provides a suitable location for depositing a uniform polymerized film. The screening plates are useful in preventing defects from an abnormal discharge such as would result at a defective electrode surface. Accordingly, a uniform and stable discharge may be expected in the plasma zone between the pair of screening plates.

Figure 2:
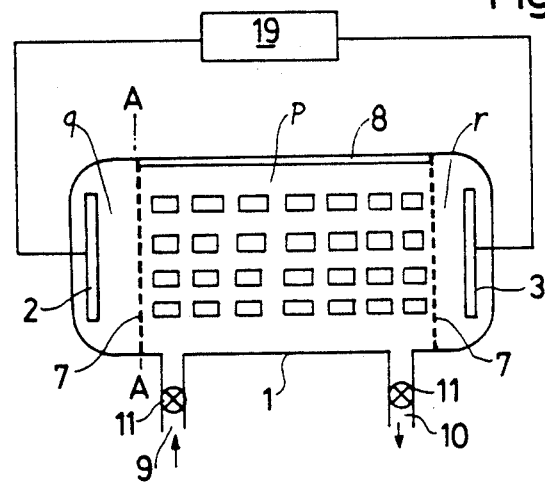
FIG. 2, FIG. 3 and FIG. 4 show schematic diagrams of embodiments of this invention.
Figure 6:
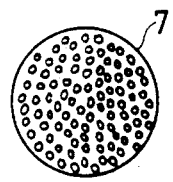
FIG. 6 is a sectional view taken along line A—A of FIG. 2; and B

Discharge tube 1 shown in FIG. 2 is provided with an inlet 9 for introducing monomer, an outlet 10 for removing monomer, and valves 11 for the inlet and outlet passages.

Having studied the high molecular weight film produced with the use of screening plates, it was found that the softening point of the organic high molecular weight film may differ according to where the substrate has been disposed within the plasma zone. Typically, the further the substrate is positioned from inlet 9, the higher is the softening point of the organic film being deposited on the substrate. This result appears to be attributed to factors such as the velocity of monomer gas within the reaction tube, variation of the partial pressure of the monomer with respect to time and space, and the energy of the glow discharge, all of which factors are associated in a complicated manner.

Figure 3:
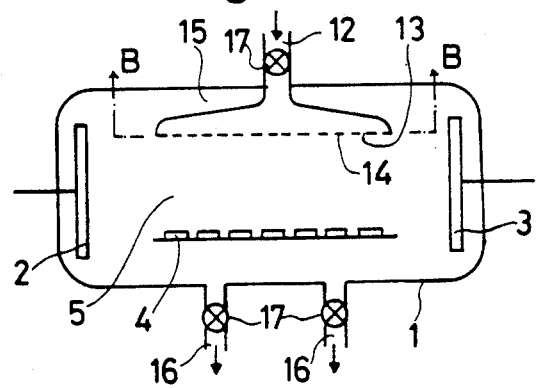
Figure 7:
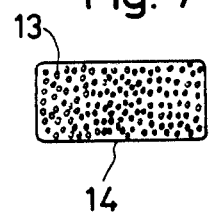
—FIG. 7 is a sectional view taken along line b—B of FIG. 3.

The device illustrated in FIG. 3 also comprises with a glow discharge reaction tube 1, discharge electrodes 2 and 3, and a group of substrates 4 horizontally disposed between the discharge electrodes such as to receive a deposit of organic high molecular weight film. In the glow discharge tube, at an upper position thereof opposing substrates 4, is mounted a monomer gas inlet 12 widening into funnel-shaped member 15 so that the bottom face thereof covers the whole area of the substrates. The bottom face is constituted by perforated-plate 14 having a multiplicity of perforations. The circular perforations may have a diameter of about 2–3 mm and may be spaced apart about 10–20 mm. The perforated plate 14 is disposed in parallel to the plane of aligned substrates 4 such to produce a uniform gap therebetween. According to this arrangement, the time needed for the monomer gas to pass from the inlet 12 up to the time of deposit on the substrate (dwelling time) may be uniform over a wide area including a number of substrates. Delivery of the monomer gas through perforations 13 in the perforated plate 14 may also be uniform over a wide area, and variation in the softening point of the deposited organic film as would otherwise result may be limited to a minimum. The discharge tube of FIG. 3 is also provided with outlets 16 and control valves 17 therefor.

The above-described method and apparatus makes it possible to deposit high molecular weight film which is soluble in an organic solvent, on a substrate arranged within an area of a glow discharge tube corresponding to the plasma zone of glow discharge; and also to deposit organic films having a substantially uniform softening point onto substrates arranged over a wide area within the plasma zone. Thus, substantially colorless, transparent organic film which is soluble in a selected organic solvent may be deposited on the surfaces of a multiplicity of substrates arranged over a wide range within the plasma zone of a glow discharge tube no matter whether the substrates are conductive or not, the film having substantially the same softening temperature at every surface point on every substrate. Further, for the sake of space economy, a plurality of units each consisting of a plurality of perforated plates for introducing the monomer gas, and a stand for supporting the substrates may be arranged one upon the other. Such an arrangement is advantageous for mass production.

Figure 4:
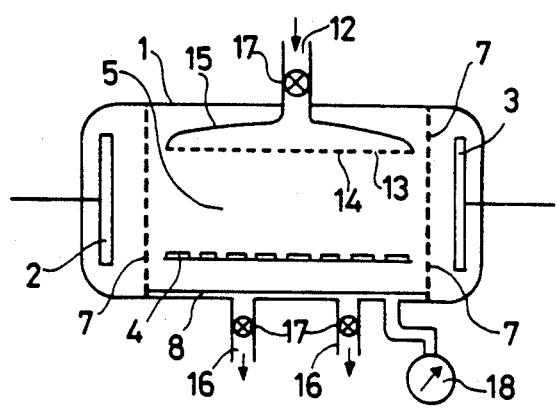

FIG. 4 shows an example of a device combining the screening plates and perforated monomer inlet plate of this invention. In FIG. 4, members 1, 2, 3, 4, 5, 7, 8, 12, 13, 14, 15, 16 and 17 correspondingly refer to like members identified in FIG. 2 and FIG. 3. Member 18 is a manometer in communication with the reaction tube 1. Substrates such as for example glass plates 4 are introduced into the glow discharge polymerization device shown in FIG. 4 wherein they are arranged as illustrated. After the interior of the tube has been evacuated up to about $10^{-5}$ Torr, styrene vapor is introduced through monomer inlet 12, and while continuing evacuation to keep the inner pressure at 0.3 Torr, a current of 100 milli ampere, 5 KHz is impressed between electrodes 2 and 3 to produce a glow discharge. After continuing the discharge for 20 minutes, the discharge is cut off, and the glass substrates are removed. A high molecular film is deposited on the glass substrates, the film being substantially colorless and transparent while having a thickness about 1 micron ($\mu$). By submerging the glass substrate having the high molecular film disposed thereon into xylene solvent, any film deposited on the substrate dissolves thoroughly.

Figure 5:
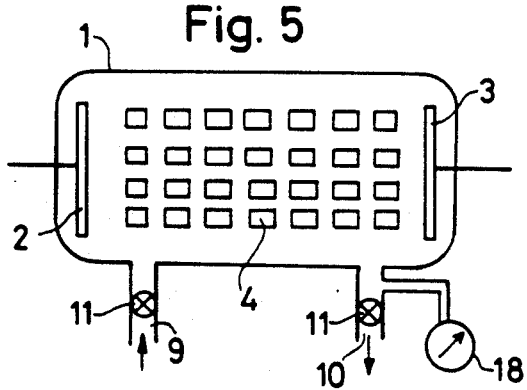
FIG. 5 is a schematic diagram illustrating a conventional method using glow discharge to deposit an organic high molecular weight film.

Chips produced by scraping the film from a coated substrate were measured in a micro-melting point meter and were found to have a softening point in a range of 60° to 67°C. This range may be contrasted to a wide variation from 45° to 102°C. for the softening point of high molecular film obtained using a glow discharge device of the prior art, i.e., a conventional device without screening plates 7 and monomer gas inlet plate 14 as shown in FIG. 5. Also, the solubility in xylene solvent of the film obtained using such a conventional device is found to have an unevenness as measured within a coating on the same glass substrate. The ratio of the substrates having imperfectly soluble film for the resultant substrates from the conventional device is about 50% in contrast to the result of 100% soluble film by practice according to this invention.

Further, some of the substrates coated by the conventional device are found to have a partially powdered deposit thereon. The conventional glow discharge reaction tube 1 illustrated in FIG. 5 has discharge electrodes 2 and 3, between which substrates 4 are arranged, monomer inlets 9, monomer outlet 10, valves 11, and a manometer 18 communicating with the reaction tube 1.

The glow discharge system according to this invention has improved effectiveness by:

1. Providing a pair of screening plates with perforations, the plates being disposed in the vicinity of the ends of the plasma zone between glow discharge electrodes, such that a space suitable for depositing a uniform polymerized film may be realized in the plasma zone between said screening plates, and/or 2. Introducing monomer gas through a perforated plate toward a group of substrates arranged in the plasma zone, such that the deposited organic film is uniformly soluble in a selected organic solvent, the softening points of the deposited film on any substrate being substantially equal no matter where deposit over a wide area of the plasma zone is effected.

It is understood that the foregoing detailed description is given merely by way of illustration and that many variations may be made therein without departing from this invention.

What is claimed is:

1. A method of producing an organic high molecular weight film soluble in an organic solvent and having an essentially uniform softening temperature in a glow discharge tube having discharge electrodes defining a plasma zone therebetween, which comprises the steps of electrically floatingly disposing at least one substrate within the plasma zone, disposing a pair of opposed perforated screening plates between the discharge electrodes, a respective one of the screening plates being adjacent a respective end of the plasma zone, each screening plate being disposed between one of the electrodes and one of the plasma zone ends, passing electric discharge from the discharge electrodes through the screening plates, electrically connecting the screening plates to each other, mounting a perforated plate between the screening plates and parallel to the substrate, the perforated plate extending over the whole area of the substrate, introducing a monomer through the perforated plate into the plasma zone, and depositing the monomer on the substrate to form the film.

2. A method of producing an organic high molecular weight film soluble in an organic solvent and having an essentially uniform softening temperature in a glow discharge tube having discharge electrodes defining a plasma zone therebetween, which comprises the steps of electrically floatingly disposing at least one substrate within the plasma zone, disposing a pair of opposed perforated screening plates between the discharge electrodes, a respective one of the screening plates being adjacent a respective end of the plasma zone, each screening plate being disposed between one of the electrodes and one of the plasma zone ends, passing electric discharge from the discharge electrodes through the screening plates, electrically connecting the screening plates to each other, introducing a monomer into the plasma zone, depositing the monomer on the substrate to form the film.

3. A method of producing an organic high molecular weight film soluble in an organic solvent and having an essentially uniform softening temperature in a glow discharge tube having discharge electrodes defining a plasma zone therebetween, which comprises the steps of electrically floatingly disposing at least one substrate within the plasma zone, passing electric discharge between the discharge electrodes, mounting a perforated plate between the screening plates and parallel to the substrate, the perforated plate extending over the whole area of the substrate, introducing a monomer through the perforated plates into the plasma zone, and depositing the monomer on the substrate to form the film.

4. An organic high molecular weight film coated substrate prepared by the method of claim 1.

5. An organic high molecular weight film coated substrate prepared by the method of claim 2.

6. An organic high molecular weight film coated substrate prepared by the method of claim 3.

* * * * *